United States Patent
Tseng et al.

(10) Patent No.: US 10,273,143 B2
(45) Date of Patent: Apr. 30, 2019

(54) METHOD AND APPARATUS FOR REDUCING IN-PROCESS AND IN-USE STICTION FOR MEMS DEVICES

(71) Applicant: Taiwan Semiconductor Manufacturing Company, Ltd., Hsinchu (TW)

(72) Inventors: Lee-Chuan Tseng, New Taipei (TW); Chang-Ming Wu, New Taipei (TW); Shih-Chang Liu, Alian Township (TW); Yuan-Chih Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/850,677

(22) Filed: Dec. 21, 2017

(65) Prior Publication Data
US 2018/0134542 A1    May 17, 2018

Related U.S. Application Data

(62) Division of application No. 14/873,243, filed on Oct. 2, 2015, now Pat. No. 9,878,899.

(51) Int. Cl.
*B81B 3/00*    (2006.01)
*B81C 1/00*    (2006.01)

(52) U.S. Cl.
CPC .......... *B81B 3/001* (2013.01); *B81C 1/0092* (2013.01); *B81C 1/0096* (2013.01);
(Continued)

(58) Field of Classification Search
CPC . B81B 3/001; B81C 1/00936; B81C 1/00992; B81C 2201/056; B81C 2201/0132; B81C 1/0092–1/00984
See application file for complete search history.

(56) References Cited

U.S. PATENT DOCUMENTS 6,465,355 B1 * 10/2002 Horsley .............. B81C 1/00142
                                                                438/694
7,225,524 B2 * 6/2007 Lee ........................ B81B 3/0035
                                                                216/62

(Continued)

FOREIGN PATENT DOCUMENTS

CN    103262207 A    8/2013
CN    103476702 A    12/2013
(Continued)

OTHER PUBLICATIONS

German Application No. 102015117141.4, Office Action dated May 31, 2016, 10 pgs.

*Primary Examiner* — Bac H Au
(74) *Attorney, Agent, or Firm* — Haynes and Boone, LLP

(57) ABSTRACT

The present disclosure involves forming a method of fabricating a Micro-Electro-Mechanical System (MEMS) device. A plurality of openings is formed in a first side of a first substrate. A dielectric layer is formed over the first side of the substrate. A plurality of segments of the dielectric layer fills the openings. The first side of the first substrate is bonded to a second substrate that contains a cavity. The bonding is performed such that the segments of the dielectric layer are disposed over the cavity. A portion of the first substrate disposed over the cavity is transformed into a plurality of movable components of a MEMS device. The movable components are in physical contact with the dielectric the layer. Thereafter, a portion of the dielectric layer is removed without using liquid chemicals.

20 Claims, 8 Drawing Sheets

(52) U.S. Cl.
CPC ...... *B81C 1/00936* (2013.01); *B81C 1/00944* (2013.01); *B81C 1/00952* (2013.01); *B81C 1/00984* (2013.01); *B81C 1/00992* (2013.01); *B81C 2201/0132* (2013.01); *B81C 2201/056* (2013.01)

(56) References Cited

U.S. PATENT DOCUMENTS

| | | | |
|---|---|---|---|
| 7,919,346 B2* | 4/2011 | Kaelberer | B81B 3/001 |
| | | | 257/414 |
| 8,012,785 B2 | 9/2011 | Liang et al. | |
| 8,458,888 B2 | 6/2013 | Stamper et al. | |
| 8,525,278 B2 | 9/2013 | Chu et al. | |
| 8,643,927 B2* | 2/2014 | Takubo | B81B 3/001 |
| | | | 359/224.1 |
| 8,648,468 B2 | 2/2014 | Chu et al. | |
| 8,748,205 B1 | 6/2014 | Liang et al. | |
| 9,527,721 B2* | 12/2016 | Cheng | B81B 3/0005 |
| 9,738,516 B2* | 8/2017 | Chou | B81C 1/00595 |
| 2012/0313235 A1 | 12/2012 | Chu et al. | |
| 2013/0015743 A1* | 1/2013 | Tsai | H02N 1/00 |
| | | | 310/300 |
| 2014/0264655 A1* | 9/2014 | Williams | B81B 3/001 |
| | | | 257/416 |
| 2014/0264656 A1 | 9/2014 | Ata et al. | |
| 2014/0264661 A1 | 9/2014 | Cheng et al. | |
| 2015/0298965 A1 | 10/2015 | Tsai et al. | |
| 2016/0289063 A1 | 10/2016 | Ocak et al. | |
| 2016/0362292 A1* | 12/2016 | Chang | B81B 3/001 |
| 2017/0203958 A1* | 7/2017 | Classen | B81B 7/0048 |

FOREIGN PATENT DOCUMENTS

| | | |
|---|---|---|
| CN | 104066040 A | 9/2014 |
| CN | 203998936 U | 12/2014 |
| CN | 104860258 A | 8/2015 |
| DE | 19530510 | 2/1996 |
| DE | 10324421 | 1/2005 |
| DE | 102005055083 | 5/2007 |
| DE | 102013211872 | 1/2015 |
| DE | 102013213065 | 1/2015 |
| TW | 558811 B | 10/2003 |
| TW | I397159 B | 5/2013 |
| TW | 201534140 A | 9/2015 |
| WO | WO 2011/161318 A1 | 12/2011 |
| WO | WO 2012/078139 A1 | 6/2012 |
| WO | WO 2015/001325 A1 | 1/2015 |

* cited by examiner

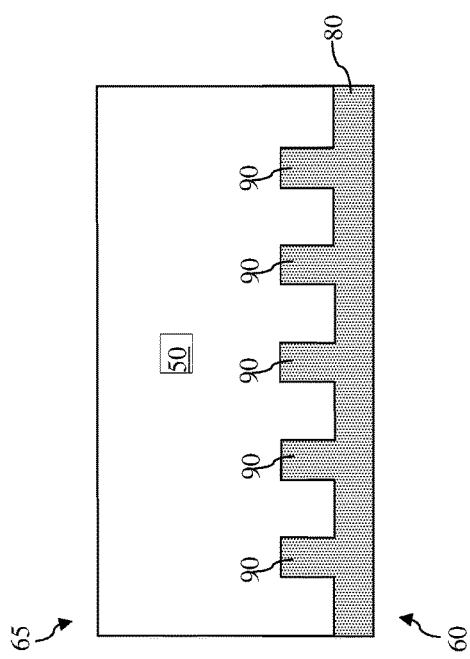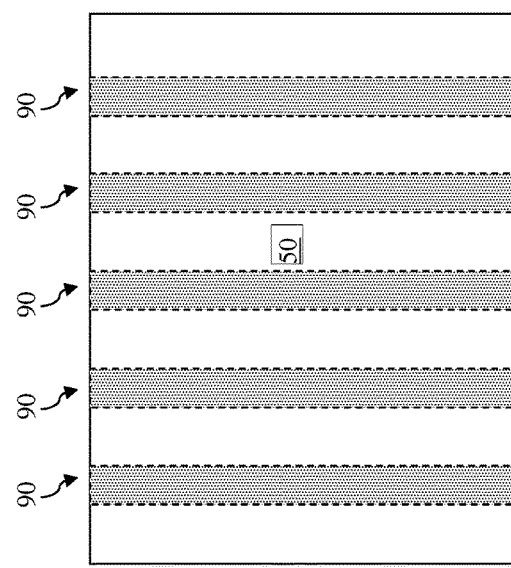
Fig. 3B
Fig. 3A

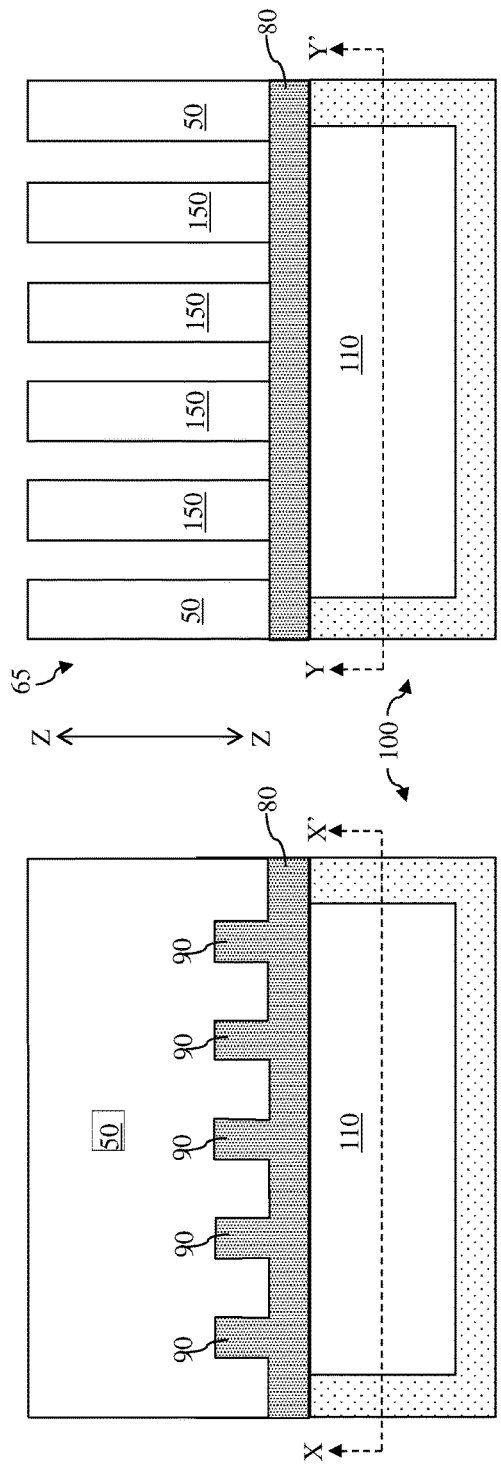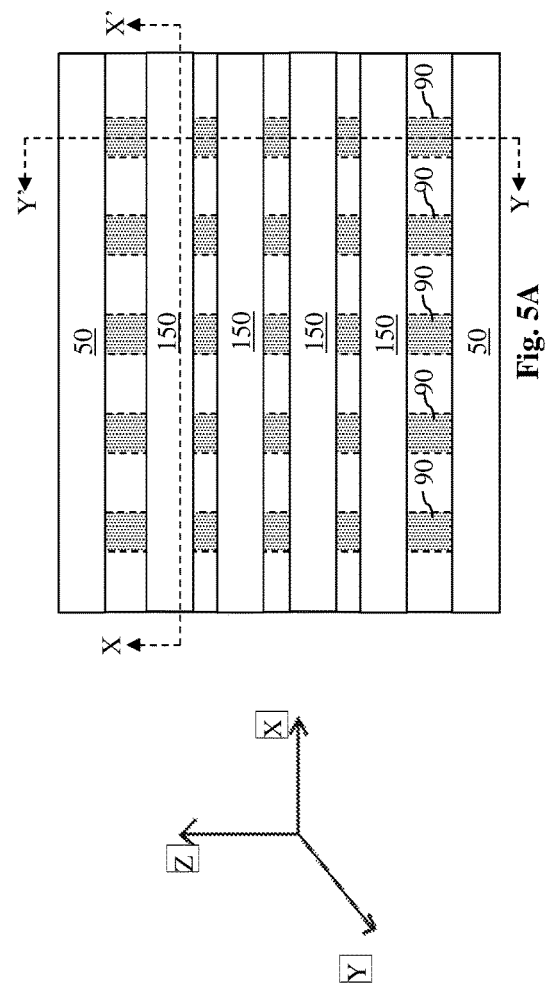

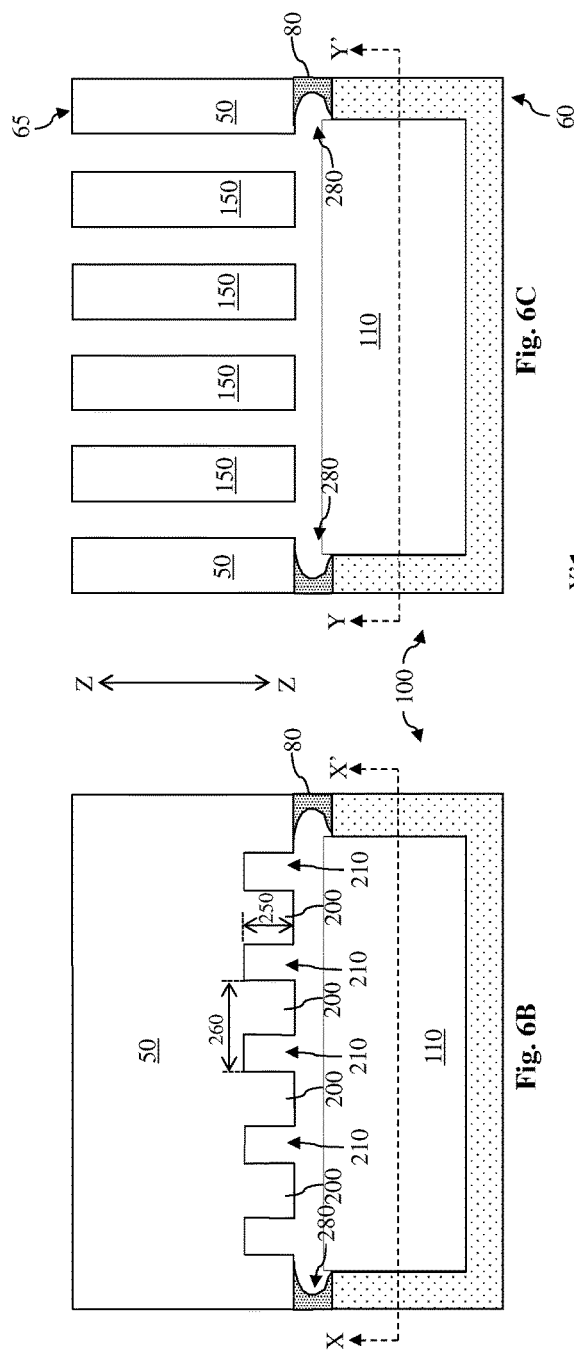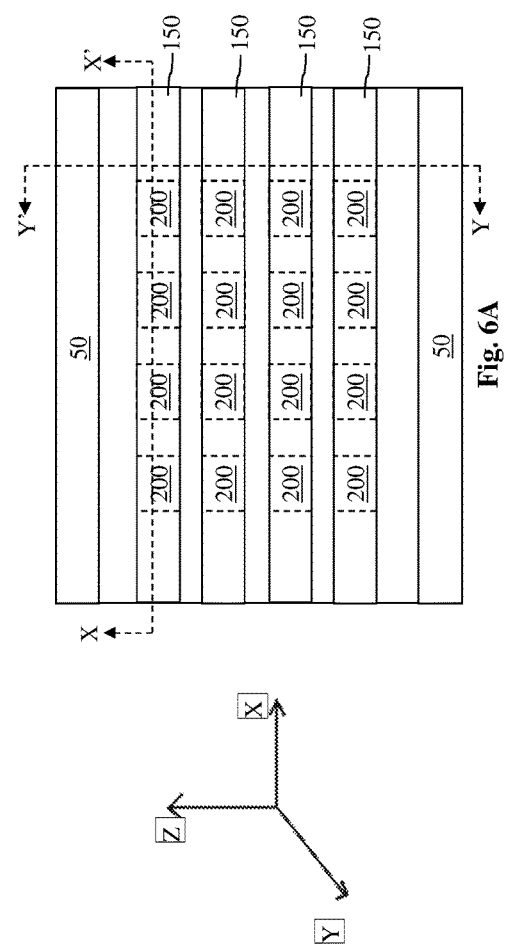

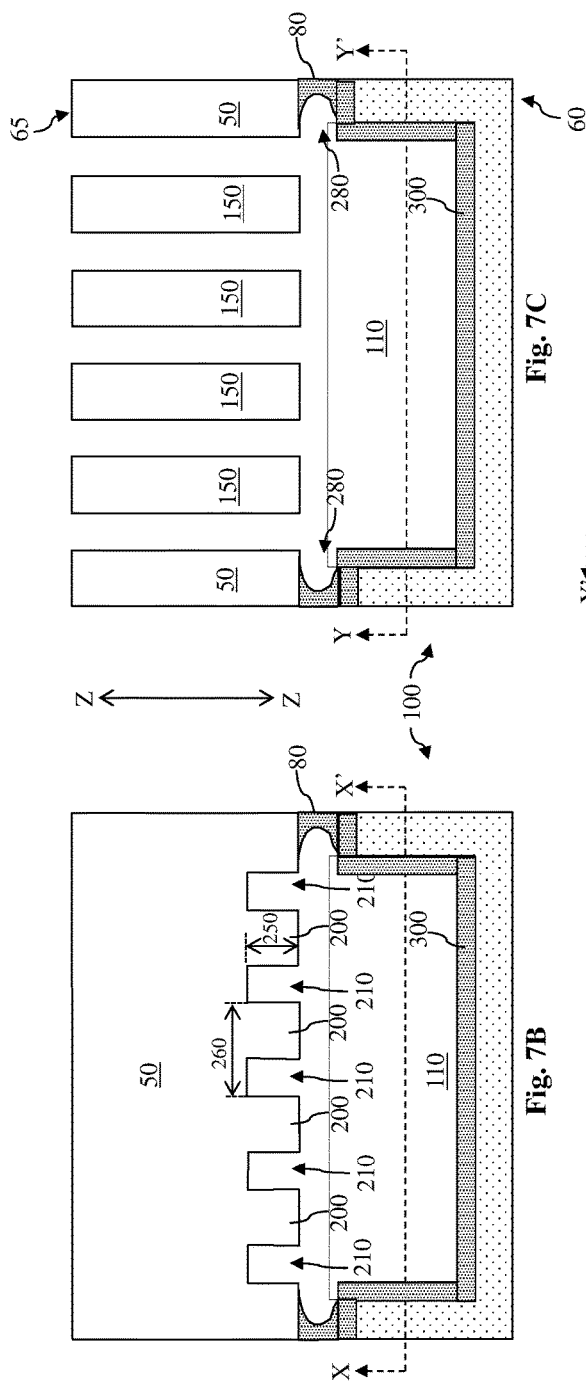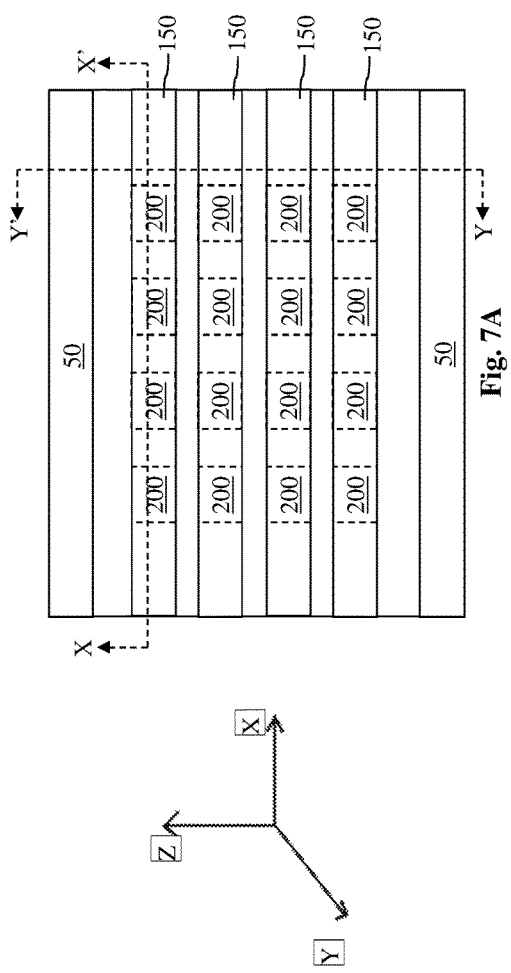

METHOD AND APPARATUS FOR REDUCING IN-PROCESS AND IN-USE STICTION FOR MEMS DEVICES

PRIORITY DATA

The present application is a divisional of U.S. patent application Ser. No. 14/873,243, filed Oct. 2, 2015, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

As semiconductor technology evolves, Micro-Electro-Mechanical (or Micro-Electrical-Mechanical) System (MEMS) devices may be fabricated using standard semiconductor techniques and equipment. However, conventional methods of fabricating MEMS devices may suffer from stiction (static friction) problems, which may degrade the performance of the MEMS device or even render it defective in some situations.

Therefore, while conventional MEMS device fabrication has been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-7A are diagrammatic top views of a semiconductor device that includes a MEMS device at various stages of fabrication in accordance with some embodiments of the present disclosure.

FIGS. 1B-7B are diagrammatic cross-sectional side views of the semiconductor device that includes a MEMS device at various stages of fabrication in accordance with some embodiments of the present disclosure.

FIGS. 5C-7C are different diagrammatic cross-sectional side views of the semiconductor device that includes a MEMS device at various stages of fabrication in accordance with some embodiments of the present disclosure.

DETAILED DESCRIPTION

Figure 1B:
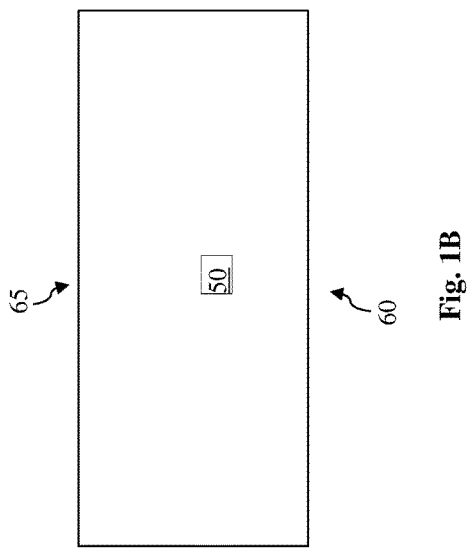

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication technologies continue to evolve, Micro-Electro-Mechanical (or Micro-Electrical-Mechanical) System (MEMS) devices may be fabricated using standard semiconductor techniques and equipment. MEMS devices include electrical/mechanical devices formed on a miniature scale, such as sensors, actuators, mirrors, gyroscopes, accelerometers, or other small machines. As an example, these tiny MEMS devices may be formed at least in part by patterning appropriate portions of a wafer (e.g., a silicon wafer). A MEMS device may also have one or more processors or controllers that communicate with and/or control the mechanical components. The MEMS devices may have device sizes ranging from about 1 micron to 1000 microns, and may have MEMS device components that have sizes ranging from about 0.1 micron to 100 microns.

As miniature machines, the MEMS devices may have small mechanical components that are movable (e.g., up or down, left or right, front or back). These movable components may come into close proximity within one another (or with other nearby surfaces) and stick together due to various forces, such as capillary forces, molecular Van Der Waals forces, or electrostatic forces, etc. Once the movable components are in contact with each other, they need to overcome static friction (referred to as stiction) in order to be separated again. Stiction problems can arise during the fabrication of the MEMS device (also referred to as in-process stiction) or during the actual use of the MEMS device (also referred to as in-use stiction). If stiction problems cannot be overcome, the MEMS device's performance may be degraded, or device failure may even occur.

The present disclosure is directed to a MEMS device and a fabrication method thereof that reduce the in-process stiction or in-use stiction problems, as discussed in more detail below with reference to FIGS. 1A-7A, 1B-7B, 5C-7C, and 8. FIGS. 1A-7A are diagrammatic top views of a portion of a MEMS wafer 50 at various stages of fabrication, and FIGS. 1B-7B are diagrammatic cross-sectional side views of the portion of the MEMS wafer 50 (or a MEMS substrate) at various stages of fabrication, and FIGS. 5C-7C are diagrammatic cross-sectional side views (taken from a different perspective) of the portion of the MEMS wafer 50 at various stages of fabrication.

Figure 1A:
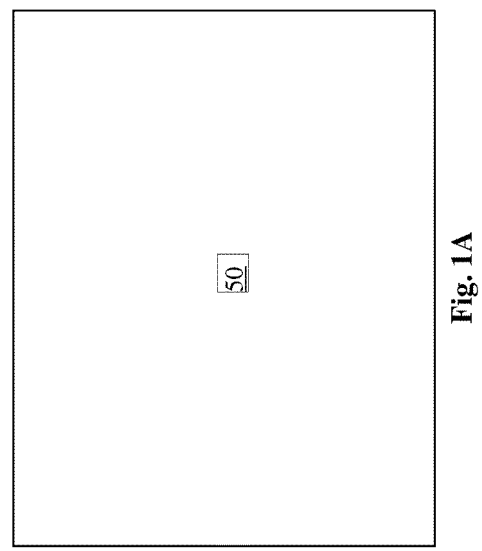

Referring to FIGS. 1A-1B, the MEMS wafer 50 is a wafer from which one or more MEMS devices will be made. In some embodiments, the MEMS wafer 50 contains silicon, or may be referred to as a silicon wafer or as a silicon substrate. The MEMS wafer 50 has a side 60 (shown as the bottom side in FIG. 1B) and an opposite top side 65 (shown as the top side in FIG. 1B). It is understood that the top view in FIG. 1A is obtained by "looking down" from the top side 65.

Figure 2A:
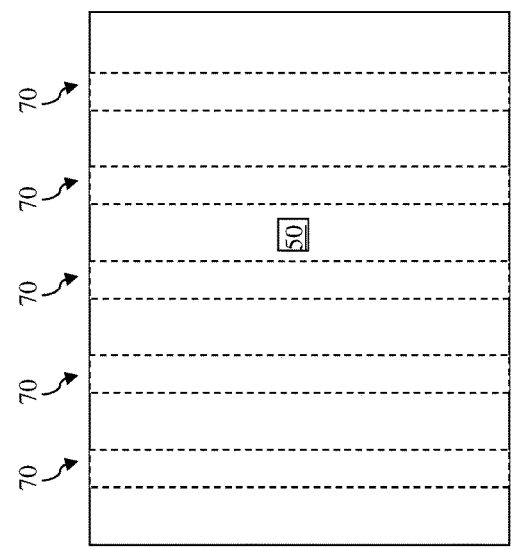
Figure 2B:
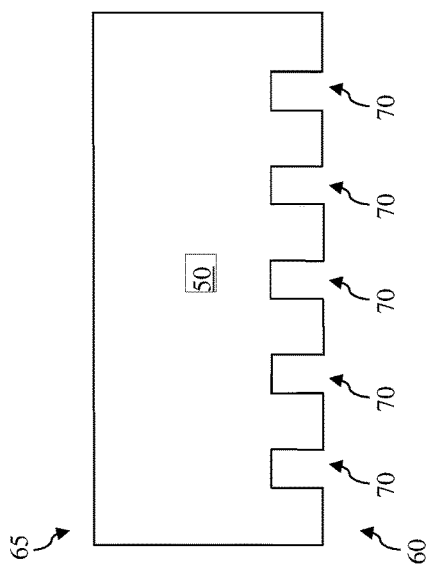

Referring now to FIGS. 2A-2B, a plurality of trenches or openings 70 are formed in the MEMS wafer 50 from the side 60. The trenches 70 may be formed by an etching process, for example a dry etching process or a wet etching process. In the top view of FIG. 2B, the trenches 70 are illustrated as dashed or broken lines, even though they would not be directly visible in the top view (because the rest of the MEMS wafer 50 would obstruct the view of the trenches 70).

Referring now to FIGS. 3A-3B, a layer 80 is formed over the side 60 of the MEMS wafer 50. The layer 80 may be formed by a suitable deposition process known in the art. In some embodiments, the layer 80 includes a dielectric material, for example silicon oxide. In other embodiments, the layer 80 may include photoresist. The layer 80 fills the trenches 70. Segments of the layer 80 filling the trenches 70 are labeled as segments 90 in FIG. 3B that appear "embedded" into the MEMS wafer 50. Alternatively stated, the segments 90 of the layer 80 protrude toward the side 65 of the MEMS wafer 50. Again, even though the segments 90 of the layer 80 are not directly visible in the top view of FIG. 3A, they are illustrated as dashed or broken lines in FIG. 3A for purposes of clarity.

Figure 4A:
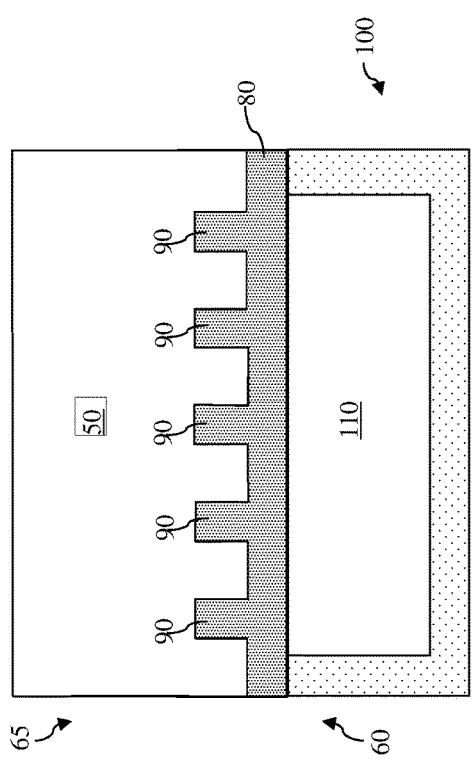
Figure 4B:
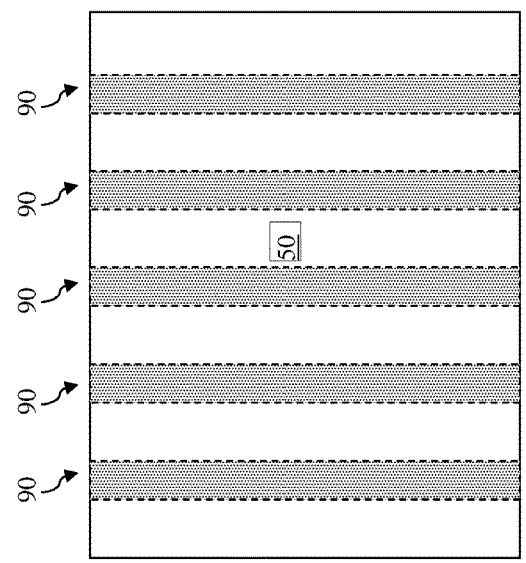

Referring now to FIGS. 4A-4B, a wafer 100 is bonded to the MEMS wafer 50 through the side 60. In some embodiments, the bonding may be an optical bonding process or a fusion bonding process. The wafer 100 may be a semiconductor wafer or include a semiconductor substrate and may contain various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The wafer 100 may also be referred to as a silicon wafer or a CMOS wafer.

The wafer 100 contains a cavity 110, which is shown in the cross-sectional view of FIG. 4B but not specifically illustrated in the top view of FIG. 4A for reasons of simplicity. The bonding between the MEMS wafer 50 and the wafer 100 is performed such that the layer 80 is bonded between the wafers 50 and 100, and that the layer 80 is located over the cavity 110 after the bonding.

Referring now to FIGS. 5A, 5B, and 5C, a plurality of movable MEMS components 150 is formed by patterning (e.g., etching) the MEMS wafer 50 from the side 65. The layer 80 may serve as an etching-stop layer during the patterning of the MEMS wafer 50 to form the movable MEMS components 150. The movable MEMS components 150 are designed to move (for example vertically or laterally) when the MEMS device is fabricated and is in use, but it is not desirable for the movable MEMS components 150 to have much movement during the fabrication of the MEMS device, as that may lead to stiction problems. Here, the layer 80 restricts the movement of the movable components 150 during the fabrication processes, thereby reducing stiction problems.

In more detail, FIG. 5A is a diagrammatic fragmentary top view of the MEMS wafer 50 being bonded to the wafer 100. FIG. 5B is a diagrammatic cross-sectional side view of the MEMS wafer 50 and the wafer 100, where the cross-sectional side view is taken along an X-direction or X-axis (shown as from X-X' in FIGS. 5A-5B). FIG. 5C is another diagrammatic cross-sectional side view of the MEMS wafer 50 and the wafer 100, where the cross-sectional side view is taken along a Y-direction or Y-axis (shown as from Y-Y' in FIGS. 5A and 5C). In the illustrated embodiment, the X-axis and the Y-axis are perpendicular to each other and collectively define a horizontal plane (or X-Y plane). A Z-direction or Z-axis is perpendicular to (or orthogonal to) the X-direction/axis and the Y-direction/axis. In other words, whereas the X-axis and the Y-axis collectively define a horizontal plane, the Z-direction/axis is a vertical direction/axis. The MEMS wafer 50 and the wafer 100 are bonded together in the Z-direction/axis. The top view of FIG. 5A is also obtained by "looking down" toward the MEMS wafer 50 and the wafer 100 along the Z-axis.

In the embodiment shown in the top view in FIG. 5A, the movable MEMS components 150 each have an elongate shape and extend in the X-direction or along the X-axis, and the segments 90 of the layer 80 each have an elongate shape and extend in the Y-direction or along the Y-axis. The elongate shape of the segments 80 is not as obvious in FIG. 5A due to the segments being "covered up" by the movable MEMS components 150, but their elongate shapes are more readily apparent in FIG. 4A. It may be said that for each movable MEMS component 150, a plurality of the segments 90 are embedded in them, from the side 60 toward the side 65. In addition, it can be seen from FIGS. 5A-5C that the segments 90 are separated from each other in the X-direction or along the X-axis, and the movable MEMS components 150 are separated from each other in the Y-direction or along the Y-axis.

The formation (or the presence of) the layer 80 reduces the likelihood of stiction problems during the fabrication of the movable MEMS components 150. For example, if one or more of the movable components 150 move toward another one of the movable components 150, they may stick together, thereby giving rise to the stiction problem discussed above. According to the various aspects of the present disclosure, however, the layer 80 effectively "locks" the MEMS components 150 in place and prevents their movement in either the X-direction or in the Y-direction. For example, the bonding forces between the layer 80 and the movable MEMS components 150 means that the movable MEMS components 150 are attached to, or secured by the layer 80. Since the layer 80 is stationary or unmoving during the fabrication processes herein (for example during the etching of the MEMS wafer 50 to form the movable MEMS components 150), the movable MEMS components 150 are effectively "locked" to the stationary layer 80 and consequently will not move toward each other or toward other device surfaces. In addition, the segments 90 protrude (from the side 60 toward the side 65) into the bottom of each of the movable MEMS components 150. This further prevents the movable MEMS components 150 from moving in the X-direction or along the X-axis. For these reasons, the movable MEMS components 150 are less likely to come into contact with each other or with other parts of the MEMS wafer or the wafer 100. Therefore, in-process stiction problems are less likely to occur.

Referring now to FIGS. 6A-6C, a dry release process is applied to clean the surfaces of the movable MEMS components 150, as well as to remove a portion of the layer 80 in (or above) the cavity 110. The cleaning is performed so as to remove debris or other contaminant particles generated (e.g., by the etching process) as a part of the formation of the movable MEMS components. The portion of the layer 80 below the movable MEMS components 150 is removed so that the movable MEMS components 150 can freely move, since the movable MEMS components will no longer be restricted by the layer 80 that would otherwise lock them in place. In this manner, it may be said that the layer 80 is "released" from the movable MEMS components 150, or that the movable MEMS components 150 are "released" from the layer 80.

As the name implies, the dry release process is performed without using liquid (or wet) chemicals. In some embodiments, the dry release process includes applying a vapor hydrofluoric (vHF) acid (hydrofluoric acid in vapor form). The use of non-liquid chemicals to remove the layer 80 is beneficial for stiction purposes. In more detail, as a part of conventional MEMS device fabrication, a wet cleaning process may be performed to clean the surfaces of the MEMS components or other surfaces. Such wet cleaning process removes the debris or other contaminant particles produced as a part of the etching process to form the movable MEMS components. However, the wet cleaning process lead to wet surfaces of the MEMS components, which may make the MEMS components more likely to stick together and also harder to separate once they are stuck together. In other words, the liquid chemicals used in conventional wet cleaning processes may exacerbate stiction problems for MEMS devices.

In comparison, the dry release process involves no liquid chemicals, which means that the surfaces of the movable MEMS components 150 (and surfaces of other devices) are substantially drier than they would have been if a wet cleaning process had been used. The drier surfaces herein reduce the likelihood of the movable MEMS components 150 sticking to each other or sticking to other surfaces, for example sticking to surfaces of the MEMS wafer 50 or sticking to surfaces of the wafer 100. Even if the movable MEMS components 150 somehow make physical contact with one another or with other surfaces, the drier surfaces herein reduce surface attraction so that the components in physical contact with one another can still be more easily separated. As such, in-process stiction problems are less likely to occur, and they can be easily resolved even if they do occur.

According to the various aspects of the present disclosure, in-use stiction issues are also improved. As can be seen in FIG. 6B, after the removal of the layer 80 below the movable MEMS components 150, a plurality of bumps 200 are formed at the bottom side (i.e., the side 60) of each of the movable MEMS components 150. As a result of the fabrication processes discussed above, the bumps 200 are "self-aligned" with the movable MEMS components 150.

These bumps 200 are separated from one another in the X-direction (or along the X-axis) by a plurality of gaps or trenches 210, which are derived from the trenches 70 discussed above with reference to FIG. 2B. The bumps 200 are not directly visible in the top view of FIG. 6A, but for the sake of clarity, they are illustrated as dashed or broken lines in FIG. 6A.

The movable MEMS components 150 having such structure as illustrated in FIGS. 6A-6B (i.e., with the bumps 200 separated by gaps 210 as its bottom side) offer improved in-use stiction. In more detail, in-use stiction refers to situations where the movable MEMS components 150 get stuck to each other or to other surfaces, such as the bottom surface of the cavity 110, while the MEMS device is actually being used in a real world application (post fabrication). Stiction is correlated with an amount of surface area. Generally, the larger the surface area, the more likely stiction issues may arise and also the harder the stiction problems can be overcome.

According to the various aspects of the present disclosure, the movable MEMS components 150 have reduced surface area. This is at least in part due to the gaps or trenches 210. In other words, the bottom portion of each of the movable MEMS components 150 has a plurality of hollow segments (i.e., the gaps or trenches 210), which do not have any surface area. As a result, both the bottom surface area and the side surface area of the movable MEMS components 150 are reduced. The reduced bottom surface area and reduced side surface area therefore alleviate in in-use stiction problems.

As is shown in FIG. 6B, the bumps 200 have a depth (or height) 250. The depth 250 is measured in the Z-direction and is also substantially equal to the depth of the trenches 210. In some embodiments, the depth 250 is in a range from about 0.2 microns to about 2 microns. The bumps 200 also have a critical dimension 260. The critical dimension 260 is measured in the X-direction and may also be referred to as the pitch. In other words, the critical dimension 260 is the sum of the lateral dimension of one of the bumps 200 and the lateral dimension of one of the gaps/trenches 210. In some embodiments, the critical dimension 260 is in a range from about 0.2 microns to about 10 microns.

These ranges of dimensions for the depth 250 and the critical dimension 260 are not randomly chosen but actually are configured such that the trenches 210 and the bumps 200 would not be too difficult to form, while at the same time ensuring that: 1. the segments 90 (shown in FIG. 5B and corresponding to the trenches 210 in FIG. 6B) are large enough to help "lock" the MEMS components 150 in place during fabrication; and 2. there is sufficient surface area reduction for the movable MEMS components 150 so as to alleviate potential in-use stiction problems.

FIGS. 6B-6C also visually illustrate a unique physical characteristic of the MEMS device fabricated herein as a result of the dry release process—the portion of the layer 80 bonded between the MEMS wafer 50 and the wafer 100 has a recessed (or curved inward) side surface 280 after the dry release process is performed. In other words, the dry release process not only removes the portion of the layer 80 directly below the movable MEMS components 150, but it also etches away a portion of the layer 80 bonded between the MEMS wafer 50 and the wafer 100. In some embodiments, the recessed side surface 280 curves inward by about 0.2 microns to about 10 microns. In comparison, in conventional MEMS fabrication, the bonding layer bonded between a MEMS wafer and another wafer will not have a recessed or curved side surface. Rather, such bonding layer may have a substantially straight side surface. Therefore, MEMS devices fabricated using the method discussed above will likely exhibit a recessed sidewall surface for the bonding layer similar to the recessed side surface 280 shown in FIGS. 6B-6C discussed herein.

FIG. 7A is a diagrammatic fragmentary top view of a MEMS device according to an alternative embodiment of the present disclosure, and FIGS. 7B-7C are different diagrammatic fragmentary cross-sectional side views of the MEMS device according to the alternative embodiment of the present disclosure. For reasons of consistency and clarity, similar elements between FIGS. 6A-6C and FIGS. 7A-7C are labeled the same herein.

In the embodiment shown in FIGS. 7A-7C, the same fabrication processes discussed above in association with FIGS. 1A-6A, 1B-6B, and 5C-6C are performed. Namely, a layer 80 is formed on the bottom side 60 of the MEMS wafer 50, the layer 80 has a plurality of segments that protrude into the MEMS wafer 50 toward the top side 65. Again, this layer 80 locks the movable MEMS components 150 in place during fabrication, thereby reducing "in-process" stiction problems. This layer 80 is also removed using a dry release process, thereby further reducing "in-process" stiction problems. The resulting bump structures 200 separated by the gaps 210 at the bottom of the movable MEMS components 150 lead to surface area reduction, thereby reducing "in-use" stiction problems. In addition to these processes, however, the embodiment shown in FIGS. 7A-7C also forms a bonding layer 300 between the MEMS wafer 50 and the wafer 100. This layer 300 may contain a dielectric material, for example silicon oxide in some embodiments. Among other things, the layer 300 may facilitate the bonding between the MEMS wafer 50 and the wafer 100. Portions of the bonding layer 300 may still remain in the cavity 110 in the final MEMS device product.

Figure 8:
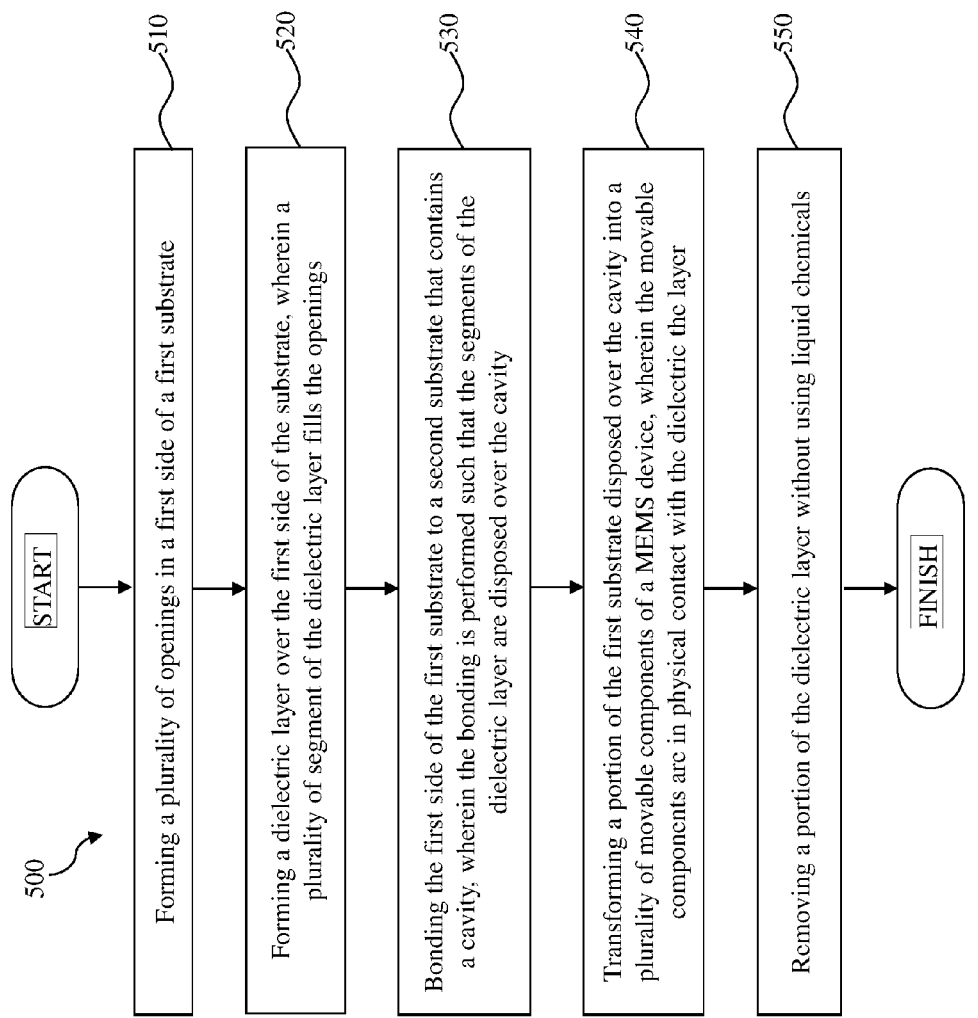
FIG. 8 is a flowchart illustrating a method of fabricating a MEMS device in accordance with some embodiments of the present disclosure.

FIG. 8 is a flowchart of a method 500 of fabricating a Micro-Electro-Mechanical System (MEMS) device according to various aspects of the present disclosure.

The method 500 includes a step 510 of forming a plurality of openings in a first side of a first substrate. In some embodiments, the first substrate is a MEMS substrate or a portion of a MEMS wafer and may contain a semiconductor material such as silicon.

The method 500 includes a step 520 of forming a dielectric layer over the first side of the substrate. A plurality of segments of the dielectric layer fills the openings. In some embodiments, the dielectric layer contains silicon oxide.

The method 500 includes a step 530 of bonding the first side of the first substrate to a second substrate that contains a cavity. The bonding is performed such that the segments of the dielectric layer are disposed over the cavity. In some embodiments, the second substrate is a portion of a silicon wafer or a CMOS wafer.

The method 500 includes a step 540 of transforming a portion of the first substrate disposed over the cavity into a plurality of movable components of a MEMS device. The movable components are in physical contact with the dielectric the layer. In some embodiments, the transforming comprises performing an etching process from a second side of the first substrate opposite the first side, such that a portion of the first substrate is etched into the plurality of movable components of the MEMS device. The dielectric layer may serve as an etching-stop layer for the etching process.

In some embodiments, the segments of the dielectric layer are spaced apart from each other along a first axis in a horizontal plane, and the movable components of the MEMS device are spaced apart from each other along a second axis in the horizontal plane. The second axis is perpendicular to the first axis. In some embodiments, the segments of the dielectric layer each extend along the second axis, and the movable components of the MEMS device each extend along the first axis.

The method 500 includes a step 550 of removing a portion of the dielectric layer without using liquid chemicals, also known as a dry release process. In some embodiments, the removing step comprises applying a vapor hydrofluoric acid (vHF) to remove the portion of the dielectric layer.

It is understood that additional processes may be performed before, during, or after the steps 510-550 of the method 500 to complete the fabrication of the semiconductor device. For example, the movable MEMS components may be coated with a material to further avoid stiction, and the wafers herein may be diced and packaged into individual MEMS ICs. For reasons of simplicity, other additional fabrication steps are not discussed herein in detail.

Based on the above discussions, it can be seen that the present disclosure offers advantages over conventional methods and devices of fabricating MEMS devices. It is understood, however, that other embodiments may offer additional advantages, and not all advantages are necessarily disclosed herein, and that no particular advantage is required for all embodiments. One advantage is that in-process stiction problems are substantially alleviated. For example, the material layer that is formed at the bottom of the MEMS wafer effectively provides a locking mechanism for the movable MEMS components, thereby preventing these MEMS components from moving (and thus sticking to other surfaces) during fabrication. In addition, the dry release process used to clean the surfaces of the various components and to remove the aforementioned "locking" layer involves no liquid chemicals, and as such the MEMS components are less likely to get stuck to other devices. In comparison, conventional MEMS fabrication typically employs a wet cleaning process, which may cause MEMS device components to come into contact with and get stuck to other devices.

Another advantage is that the in-use stiction problems are also alleviated. Generally, stiction may be a function of surface area—that is, the bigger the surface area, the more likely stiction is to occur and the harder stiction is to be overcome. According to the various aspects of the present disclosure, the processes discussed herein result in a MEMS device (when in use) where the movable components have bottom portions that have a plurality of bumps separated by gaps. The gaps correspond to a reduction in surface area for the movable MEMS devices components. Consequently, the smaller surface area alleviates the in-use stiction problems.

Another advantage is that the present disclosure does not require significant changes to the existing method of MEMS fabrication. As such, it does not significantly increase fabrication cost, if at all.

One aspect of the present disclosure pertains to a method of fabricating a Micro-Electro-Mechanical System (MEMS) device. A layer is formed on a first side of a first substrate. The layer includes a plurality of protruding segments that are embedded in the first substrate. The first substrate is bonded to a second substrate that contains a cavity. The layer is disposed between the first substrate and the second substrate and over the cavity after the bonding. A second side of the first substrate is etched to form a plurality of movable components of a MEMS device. The second side is opposite the first side. The movable components of the MEMS device are attached to the layer.

Another aspect of the present disclosure pertains to a method of fabricating a Micro-Electro-Mechanical System (MEMS) device. A plurality of openings is formed in a first side of a first substrate. A dielectric layer is formed over the first side of the substrate. A plurality of segments of the dielectric layer fills the openings. The first side of the first substrate is bonded to a second substrate that contains a cavity. The bonding is performed such that the segments of the dielectric layer are disposed over the cavity. A portion of the first substrate disposed over the cavity is transformed into a plurality of movable components of a MEMS device.

The movable components are in physical contact with the dielectric the layer. Thereafter, a portion of the dielectric layer is removed without using liquid chemicals.

Yet another aspect of the present disclosure pertains to an apparatus that includes a Micro-Electro-Mechanical System (MEMS) device. The MEMS device includes a first substrate. The first substrate includes a cavity. The MEMS device also includes a second substrate bonded to the first substrate. The second substrate includes a plurality of movable components disposed over the cavity. The movable components each contain a plurality of bumps that protrude toward the cavity.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
   a first substrate;
   a cavity disposed in the first substrate; and
   a second substrate disposed over the first substrate and over the cavity, wherein the second substrate includes a plurality of movable components, and wherein each of the movable components include one or more trenches each defined by side surfaces and a connecting surface joining the side surfaces, wherein the connecting surface is facing the cavity.

2. The device of claim 1, wherein the first substrate includes one or more microelectronic devices.

3. The device of claim 1, further comprising a layer disposed between the first substrate and the second substrate.

4. The device of claim 3, wherein the layer contains a dielectric material or a photoresist material.

5. The device of claim 3, wherein no portion of the layer is disposed directly over the cavity.

6. The device of claim 3, wherein the layer has a recessed side surface.

7. The device of claim 6, wherein a recess defined by the recessed side surface is joined with the cavity.

8. The device of claim 1, further comprising a bonding layer disposed within the cavity.

9. The device of claim 1, wherein the trenches each have a depth that is in a range between about 0.2 microns and about 2 microns.

10. The device of claim 1, wherein:
    the movable components each have an elongated profile in a top view and each extend in a first direction in the top view; and
    the movable components are separated from one another in a second direction different from the first direction.

11. The device of claim 10, wherein for each of the movable components, the trenches located thereon are separated from other trenches located thereon in the first direction.

12. The device of claim 1, wherein movable components are hinged vertically.

13. A Micro-Electro-Mechanical System (MEMS) device, comprising:
    a first substrate;
    a cavity formed in the first substrate; and
    a second substrate bonded to the first substrate, wherein the second substrate includes a plurality of movable MEMS components that are located over the cavity;
    wherein:
    the movable MEMS components each extend in a first direction and are spaced apart from one another in a second direction different from the first direction;
    each of the movable MEMS components includes a plurality of segments that protrude toward the cavity; and
    the segments are spaced apart from one another by a plurality of trenches, wherein each of the trenches include opposing side surfaces joined by a connecting surface, wherein the connecting surface faces the cavity.

14. The MEMS device of claim 13, wherein the first substrate includes one or more microelectronic devices, and wherein the movable MEMS components are hinged vertically.

15. The MEMS device of claim 13, further comprising a layer located between the first substrate and the second substrate but not directly over the cavity, wherein the layer includes a sidewall that is recessed in the first direction.

16. An apparatus, comprising:
    a Micro-Electro-Mechanical System (MEMS) device, wherein the MEMS device includes:
    a first substrate, wherein the first substrate includes a cavity; and
    a second substrate bonded to the first substrate, wherein the second substrate includes a plurality of movable components disposed over the cavity, wherein the movable components are hinged vertically and each contain a plurality of protrusions that protrude toward the cavity.

17. The apparatus of claim 16, wherein:
    the protrusions are separated from each other along a first axis in a top view; and
    the movable components are separated from each other along a second axis in the top view, the second axis intersecting with the first axis.

18. The apparatus of claim 17, wherein the movable components each have an elongate shape in the top view and each extend along the first axis, and wherein the first axis is perpendicular to the second axis.

19. The apparatus of claim 17, wherein the protrusions are separated by a plurality of recesses that each include side surfaces and a connecting surface joining the side surfaces, wherein the connecting surface faces the cavity vertically.

20. The apparatus of claim 16, wherein the MEMS device further includes a dielectric layer disposed between the first substrate and the second substrate, wherein the dielectric layer has a recessed surface facing the cavity laterally.

* * * * *